United States Patent
Liang et al.

(12) 
(10) Patent No.: US 6,710,648 B2
(45) Date of Patent: Mar. 23, 2004

(54) AMPLIFYING CIRCUIT CAPABLE OF LIMITING AMPLITUDE OF OUTPUT SIGNAL SUPPLIED TO A SPEAKER

(75) Inventors: Te-Yu Liang, Taipei Hsien (TW); Chien-Chih Yu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 32 days.

(21) Appl. No.: 10/244,948

(22) Filed: Sep. 17, 2002

(65) Prior Publication Data

US 2003/0179039 A1 Sep. 25, 2003

(30) Foreign Application Priority Data

Mar. 22, 2002 (TW) ........................................ 91105630 A

(51) Int. Cl.$^7$ ................................................. H03F 1/36
(52) U.S. Cl. ........................................... 330/86; 330/282
(58) Field of Search .......................... 330/86, 144, 254, 330/278, 282, 284

(56) References Cited

U.S. PATENT DOCUMENTS

| | | | | |
|---|---|---|---|---|
| 5,245,229 A | * | 9/1993 | Colvin, Sr. | 330/86 |
| 5,801,588 A | * | 9/1998 | Nishiyama | 330/308 |
| 6,084,467 A | * | 7/2000 | Muza | 330/86 |

* cited by examiner

Primary Examiner—Khanh Van Nguyen
(74) Attorney, Agent, or Firm—Ladas & Parry

(57) ABSTRACT

In an amplifying circuit, an amplifier receives an input signal via a first resistor unit, and generates an output signal at an output thereof. A second resistor unit is connected between the output and input of the amplifier, and has at least one control input. The second resistor unit has a variable equivalent impedance that is controlled by a control signal received at the control input. A feedback control unit receives the output signal from the amplifier, and is operable so as to provide the control signal to the control input of the second resistor unit when the output signal does not fall within a voltage range defined by a predetermined low voltage and a predetermined high voltage to adjust the variable equivalent impedance of the second resistor unit.

14 Claims, 2 Drawing Sheets

US 6,710,648 B2

AMPLIFYING CIRCUIT CAPABLE OF LIMITING AMPLITUDE OF OUTPUT SIGNAL SUPPLIED TO A SPEAKER

CROSS-REFERENCE TO RELATED APPLICATION

This application claims priority of Taiwan patent Application No. 091105630, filed on Mar. 22, 2002.

BACKGROUND OF THE INVENTION

1. Field of the Invention

The invention relates to an amplifying circuit, more particularly to an amplifying circuit for limiting amplitude of output signal supplied to a speaker.

2. Description of the Related Art

An electronic device for multimedia applications, such as a notebook computer, is usually provided with an audio codec that receives and integrates various types of sound sources (such as wave, MIDI, CD, line IN, beep, phone line, etc.), and an amplifying circuit to amplifying the integrated audio signals for reproduction by built-in loudspeakers or external loudspeakers and earphones.

Referring to FIG. 1, a conventional amplifying circuit 6 is shown to include an operational amplifier 61, and two resistors ($Z_1$, $Z_2$). The operational amplifier 61 has an inverting input end 62 for receiving an input signal ($V_{IN}$) via the resistor ($Z_1$), a grounded non-inverting input end 61, and an output end 64. The resistor ($Z_2$) is connected between the inverting input end 62 and the output end of the operational amplifier 6. The operational amplifier 61 receives the input signal ($V_{IN}$) via the resistor ($Z_1$) and generates an output signal ($V_{OUT}$) at the output end 64. It is known that the relationship between the input and output signals ($V_{IN}$, $V_{OUT}$) is $$V_{OUT} = -\frac{Z_2}{Z_1} V_{IN},$$

wherein the ratio of the output signal ($V_{OUT}$) to the input signal ($V_{IN}$) is $$-\frac{Z_2}{Z_1},$$

which is otherwise known as the amplifier gain. The negative sign indicates that the input and output signals ($V_{IN}$, $V_{OUT}$) have an inverted relation. Thus, the amplitude of the output signal ($V_{OUT}$) depends on a ratio of impedances of the resistors ($Z_2$, $Z_1$) such that when the gain is fixed, the larger the input signal ($V_{IN}$), the larger will be the output signal ($V_{OUT}$).

However, different types of sound sources have different amplitudes. For example, MIDI generally has a relatively large amplitude. Further, due to the absence of a standard amplitude during recording of audio signals, a load, such as loudspeakers and earphones, (not shown), which is connected to the output 64 of the operational amplifier 61, may be damaged when the output signal ($V_{OUT}$) supplied by the conventional amplifying circuit 6 exceeds a fixed rated power of the load.

SUMMARY OF THE INVENTION

Therefore, the object of the present invention is to provide an amplifying circuit capable of limiting amplitude of an output signal supplied to a speaker.

According to the present invention, an amplifying circuit capable of limiting the amplitude of an output signal supplied to a speaker comprises:

a first resistor unit;

an amplifier having a first input connected to the first resistor unit, and an output, the amplifier receiving an input signal at the first input via the first resistor unit and generating the output signal at the output for supplying to the speaker;

a second resistor unit having a first end connected to the first input of the amplifier, a second end connected to the output of the amplifier, and at least one control input, the second resistor unit having a variable equivalent impedance that is controlled by a control signal received at the control input; and a feedback control unit having an input end connected to the output of the amplifier so as to receive the output signal therefrom, and at least one output end connected to the control input of the second resistor unit, the feedback control unit being operable so as to provide the control signal to the control input of the second resistor unit when the output signal does not fall within a voltage range defined by a predetermined low voltage and a predetermined high voltage to adjust the variable equivalent impedance of the second resistor unit.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
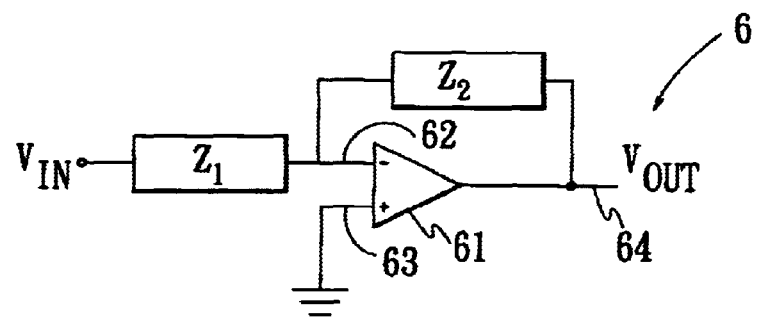
FIG. 1 is a schematic electrical circuit diagram illustrating a conventional amplifying circuit.
Figure 2:
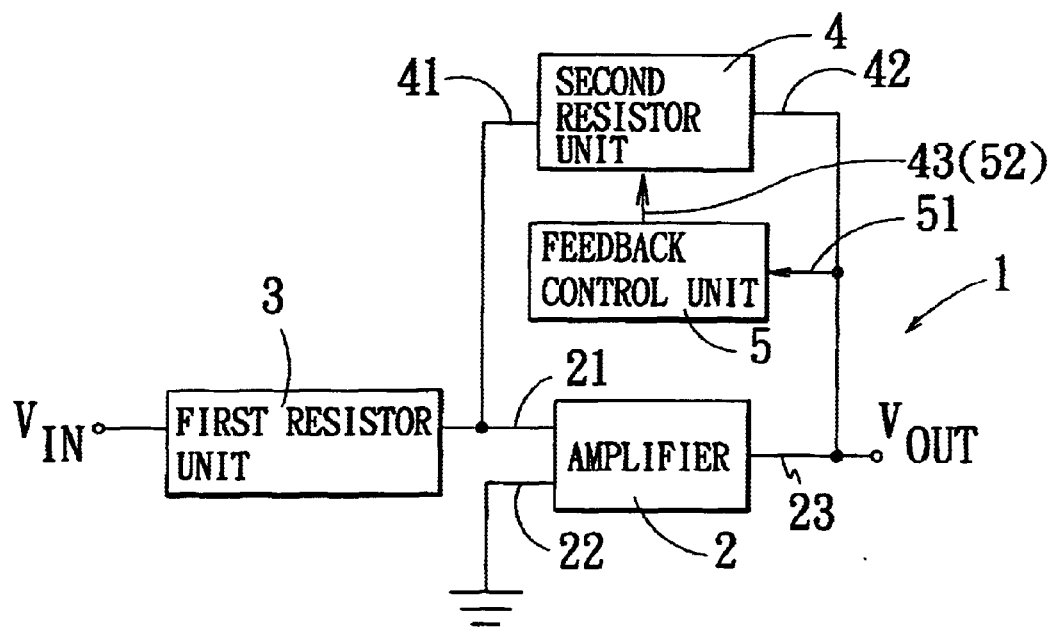
FIG. 2 is a schematic circuit block diagram illustrating the preferred embodiment of an amplifying circuit according to the present invention.
Figure 3:
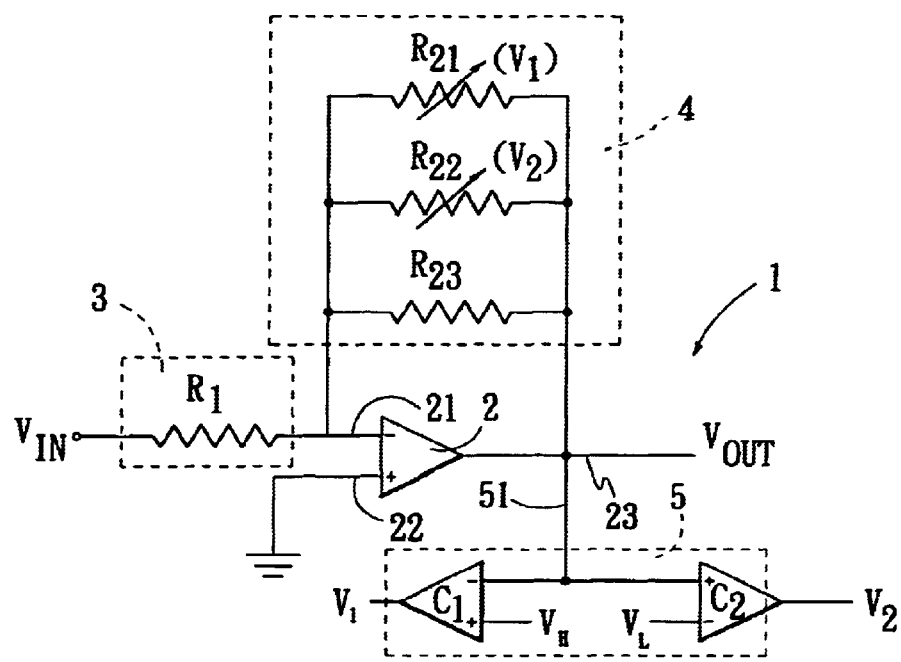
FIG. 3 is a schematic electrical circuit diagram illustrating the preferred embodiment.

Referring to FIGS. 2 and 3, the preferred embodiment of an amplifying circuit 1 according to the present invention is shown to include a first resistor unit 3, an amplifier 2, a second resistor unit 4, and a feedback control unit 5.

In this embodiment, the first resistor unit 3 includes a resistor ($R_1$) having a fixed impedance (see FIG. 3).

The amplifier 2 has a first input 21 connected to the first resistor unit 3, a grounded second input 22, and an output 23 adapted to connected to a loudspeaker (not shown). The amplifier 2 receives an input signal ($V_{IN}$) at the first input 21 via the first resistor unit 3, and generates an output signal ($V_{OUT}$) at the output 23. In this embodiment, as shown in FIG. 3, the amplifier 2 is an operational amplifier. The first input 21 is an inverting input, whereas the second input 22 is a non-inverting input.

Figure 4:
FIG. 4 is an equivalent circuit of a first/second resistor element of a second resistor unit of the preferred embodiment.

The second resistor unit 4 has a first end 41 connected to the first input 21 of the amplifier 2, a second end 42 connected to the output 23 of the amplifier 2, and at least one control input 43. The second resistor unit 4 has a variable equivalent impedance that is controlled by a control signal ($V_1$, $V_2$) received at the control input 43. As such, the amplifying circuit 1 has an amplifier gain that is a function of a ratio of an impedance of the second resistor unit 4 to the impedance of the first resistor unit 3. In this embodiment, as shown in FIG. 3, the second resistor unit 4 includes first, second and third resistor elements ($R_{21}$, $R_{22}$, $R_{23}$) connected to each other in parallel. The third resistor element ($R_{23}$) has a fixed resistance. Each of the first and second resistor elements ($R_{21}$, $R_{22}$) is a voltage-controlled resistance device having the control input 43 for receiving the control signal ($V_1$, $V_2$) so as to control a variable impedance thereof. In this embodiment, with further reference to FIG. 4, each of the first and second resistor elements ($R_{21}$, $R_{22}$) is in the form of a p-channel MOSFET (N), which has a source (S) connected to the output 23 of the amplifier 2, a drain (D) connected to the first input 21 of the amplifier 2, and a gate (G) serving as the control input 43. It is known that, when the p-channel MOSFET (N) is operated at a triode region, the higher the voltage of the control signal ($V_1$, $V_2$) received at the gate (G), the larger will be the impedance of a channel between the source (S) and the drain (D). Therefore, the p-channel MOSFET (N) can behave as a variable resistor (i.e., the first and second resistor elements ($R_{21}$, $R_{22}$)) according to the varying voltage of the control signal.

The feedback control unit 5 has an input end 51 connected to the output 23 of the amplifier 2 so as to receive the output signal ($V_{OUT}$) therefrom, and at least one output end 52 connected to the control input 43 of the second resistor unit 4. The feedback control unit 5 is operable so as to provide the control signal ($V_1$, $V_2$) to the control input 43 of the second resistor unit 4 when the output signal ($V_{OUT}$) does not fall within a voltage range defined by a predetermined low voltage ($V_L$) and a predetermined high voltage ($V_H$) to adjust the variable equivalent impedance of the second resistor unit 4. Particularly, the variable equivalent impedance of the second resistor unit 4 is reduced when the output signal ($V_{OUT}$) does not fall within the voltage range. The predetermined low voltage ($V_L$) and the predetermined high voltage ($V_H$) can be determined in accordance with a rated power of the loudspeaker. In this embodiment, the feedback control unit 5 includes first and second comparators ($C_1$, $C_2$) that are in the form of operational amplifiers, each of which has the output end 51. An inverting input end of the first comparator ($C_1$) and a non-inverting input end of the second comparator ($C_2$) are connected to the output 23 of the amplifier 2 so as to receive the output signal ($V_{OUT}$) therefrom. A non-inverting input end of the first comparator ($C_1$) receives the predetermined high voltage ($V_H$). An inverting input end of the second comparator ($C_2$) receives the predetermined low voltage ($V_L$). The first comparator ($C_1$) compares the output signal ($V_{OUT}$) with the predetermined high voltage ($V_H$), and generates the control signal ($V_1$) when the output signal ($V_{OUT}$) is greater than the predetermined high voltage ($V_H$). The second comparator ($C_2$) compares the output signal ($V_{OUT}$) with the predetermined low voltage ($V_L$), and generates the control signal ($V_2$) when the output signal ($V_{OUT}$) is less than the predetermined low voltage ($V_L$). When the first and second resistor elements ($R_{21}$, $R_{22}$) are p-channel MOSFETs, the control signal ($V_1$, $V_2$) is a low-level signal.

Accordingly, when the output signal ($V_{OUT}$) falls within the voltage range defined by the predetermined low voltage ($V_L$) and the predetermined high voltage ($V_H$), i.e., $V_L < V_{OUT} < V_H$, the comparators ($C_1$, $C_2$) output respectively a high-level signal as the control signal ($V_1$, $V_2$) such that the first and second resistor elements ($R_{21}$, $R_{22}$) have an impedance much larger than the resistance of the third resistor element ($R_{23}$). Therefore, the impedance of the second resistor unit 4 is approximately equal to the impedance of the third resistor element ($R_{23}$) such that the relationship between the output signal ($V_{OUT}$) and the input signal ($V_{IN}$) becomes $$V_{OUT} \cong -\left(\frac{R_{23}}{R_1}\right)V_{IN}.$$

When a peak value of the output signal ($V_{OUT}$) is greater than the predetermined high voltage ($V_H$), the first comparator ($C_1$) outputs a low-level signal as the control signal ($V_1$) such that the impedance of the first resistor element ($R_{21}$) is reduced. As such, the equivalent impedance of the second resistor unit 4 is approximately equal to the impedance of the first and third resistor elements ($R_{21}$, $R_{23}$) connected in parallel such that the relationship between the output signal ($V_{OUT}$) and the input signal ($V_{IN}$) becomes $$V_{OUT} = -\left(\frac{R_{21} // R_{23}}{R_1}\right)V_{IN},$$

i.e., the amplifier gain is reduced (changed from $$-\frac{R_{23}}{R_1}$$

to $$-\frac{R_{21} // R_{23}}{R_1}),$$

so as to limit the amplitude of the output signal ($V_{OUT}$) supplied to the loudspeaker.

On the other hand, when the output signal ($V_{OUT}$) is less than the predetermined low voltage ($V_L$) the second comparator ($C_2$) outputs a low-level signal as the control signal ($V_2$) such that the impedance of the second resistor element ($R_{22}$) is reduced. As such, the equivalent impedance of the second resistor unit 4 is approximately equal to the impedance of the second and third resistor elements ($R_{22}$, $R_{23}$) connected in parallel such that the relationship between the output signal ($V_{OUT}$) and the input signal ($V_{IN}$) becomes $$V_{OUT} = -\left(\frac{R_{21} // R_{23}}{R_1}\right)V_{IN},$$

i.e., the amplifier gain is reduced (changed from $$-\frac{R_{23}}{R_1}$$

to $$-\frac{R_{21} // R_{23}}{R_1}),$$

so as to limit the amplitude of the output signal ($V_{OUT}$) supplied to the loudspeaker.

It is noted that the voltage-controlled resistance device for each of the first and second resistor elements of the second resistor unit can also be in the form of an n-channel MOSFET. When the n-channel MOSFET is operated at a triode region, the higher the voltage of the control signal received at the gate, the smaller will be the impedance of a channel between the source and the drain. In this case, the control signal from the feedback control unit is a high-level signal. Furthermore, the first resistor unit 2 can be designed in a manner similar to the second resistor unit 4 to reduce the amplifier gain when the output signal ($V_{OUT}$) does not fall within the voltage range specified by the rated power of the loudspeaker.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. An amplifying circuit capable of limiting the amplitude of an output signal supplied to a speaker, comprising:
    a first resistor unit;
    an amplifier having a first input connected to said first resistor unit, and an output, said amplifier receiving an input signal at said first input via said first resistor unit and generating the output signal at said output for supplying to the speaker;
    a second resistor unit having a first end connected to said first input of said amplifier, a second end connected to said output of said amplifier, and at least one control input, said second resistor unit having a variable equivalent impedance that is controlled by a control signal received at said control input; and
    a feedback control unit having an input end connected to said output of said amplifier so as to receive the output signal therefrom, and at least one output end connected to said control input of said second resistor unit, said feedback control unit being operable so as to provide the control signal to said control input of said second resistor unit when the output signal does not fall within a voltage range defined by a predetermined low voltage and a predetermined high voltage to adjust the variable equivalent impedance of said second resistor unit.

2. The amplifying circuit as claimed in claim 1, wherein said second resistor unit includes a first resistor element, and at least one second resistor element connected to said first resistor element in parallel, said second resistor element being a voltage-controlled resistance device having said control input for receiving the control signal from said feedback control unit so as to control a variable impedance thereof.

3. The amplifying circuit as claimed in claim 2, wherein the control signal is a low-level signal, and said second resistor element includes a p-channel MOSFET.

4. The amplifying circuit as claimed in claim 2, wherein the control signal is a high-level signal, and said second resistor element includes an n-channel MOSFET.

5. The amplifying circuit as claimed in claim 1, wherein said feedback control unit includes first and second comparators, each of which has said output end, each of said first and second comparators being connected to said output of said amplifier so as to receive the output signal therefrom, said first comparator comparing the output signal with the predetermined high voltage, and generating the control signal when the output signal is greater than the predetermined high voltage, said second comparator comparing the output signal with the predetermined low voltage, and generating the control signal when the output signal is less than the predetermined low voltage.

6. The amplifying circuit as claimed in claim 5, wherein said second resistor unit includes first, second and third resistor elements connected to each other in parallel, each of said first and second resistor elements being a voltage-controlled resistance device that has said control input, said control input of said first resistor element being connected to said output end of said first comparator for receiving the control signal therefrom so as to control a variable impedance of said first resistor element, said control input of said second resistor element being connected to said output end of said second comparator for receiving the control signal therefrom so as to control a variable impedance of said second resistor element.

7. The amplifying circuit as claimed in claim 6, wherein the control signal is a low-level signal, and each of said first and second resistor elements includes a p-channel MOSFET.

8. The amplifying circuit as claimed in claim 6, wherein the control signal is a high-level signal, and each of said first and second resistor elements includes an n-channel MOSFET.

9. The amplifying circuit as claimed in claim 6, wherein said third resistor element has a fixed resistance.

10. The amplifying circuit as claimed in claim 1, wherein said amplifier further has a grounded second input.

11. The amplifying circuit as claimed in claim 10, wherein said amplifier is an operational amplifier, said first input being an inverting input, said second input being a non-inverting input, said amplifying circuit having an amplifier gain that is a function of a ratio of an impedance of said second resistor unit to an impedance of said first resistor unit.

12. The amplifying circuit as claimed in claim 11, wherein the variable equivalent impedance of said second resistor unit is reduced when the output signal does not fall within the voltage range.

13. The amplifying circuit as claimed in claim 1, wherein the variable equivalent impedance of said second resistor unit is reduced when the output signal does not fall within the voltage range.

14. An amplifying circuit capable of limiting the amplitude of an output signal supplied to a speaker, comprising:
    a first resistor unit;
    an amplifier having a first input connected to said first resistor unit, and an output, said amplifier receiving an input signal at said first input via said first resistor unit and generating the output signal at said output for supplying to the speaker;
    a second resistor unit connected between said first input and said output of said amplifier, one of said first and second resistor units having at least one control input, said one of said first and second resistor units having a variable equivalent impedance that is controlled by a control signal received at said control input; and
    a feedback control unit having an input end connected to said output of said amplifier so as to receive the output signal therefrom, and at least one output end connected to said control input of said one of said first and second resistor units, said feedback control unit being operable so as to provide the control signal to said control input of said one of said first and second resistor units when the output signal does not fall within a voltage range defined by a predetermined low voltage and a predetermined high voltage to adjust the variable equivalent impedance of said one of said first and second resistor units.

* * * * *